(12) United States Patent
Iida

(10) Patent No.: US 8,993,105 B2
(45) Date of Patent: Mar. 31, 2015

(54) MULTILAYER CERAMIC SUBSTRATE AND METHOD FOR PRODUCING THE SAME

(75) Inventor: Yuichi Iida, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 85 days.

(21) Appl. No.: 12/940,073

(22) Filed: Nov. 5, 2010

(65) Prior Publication Data
US 2011/0045242 A1    Feb. 24, 2011

Related U.S. Application Data

(63) Continuation of application No. PCT/JP2009/057896, filed on Apr. 21, 2009.

(30) Foreign Application Priority Data

May 15, 2008   (JP) .................................. 2008-128102
Dec. 26, 2008  (JP) .................................. 2008-332086

(51) Int. Cl.
*B32B 3/24* (2006.01)
*B32B 7/02* (2006.01)
(Continued)

(52) U.S. Cl.
CPC ........ *H05K 1/183* (2013.01); *B32B 7/02* (2013.01); *H01L 23/13* (2013.01); *H01L 23/5385* (2013.01); *H05K 3/4629* (2013.01); *H05K 3/4688* (2013.01); *B32B 18/00* (2013.01); *B32B 3/266* (2013.01); *B32B 2250/42* (2013.01); *B32B 2250/40* (2013.01); *H01L 2924/09701* (2013.01); *H05K 1/0271* (2013.01); *H05K 1/0306* (2013.01); *H05K 3/462* (2013.01);
(Continued)

(58) Field of Classification Search
None
See application file for complete search history.

(56) References Cited

U.S. PATENT DOCUMENTS 6,743,316 B2 *  6/2004  Harada et al. ............. 156/89.11
6,815,046 B2 * 11/2004  Mandai et al. ................ 428/210
(Continued)

FOREIGN PATENT DOCUMENTS

EP    1 786 249 A1    5/2007
JP    6-29664 A       2/1994
(Continued)

OTHER PUBLICATIONS

English Abstract for JP 06-029664 A, Feb. 1994.*
(Continued)

*Primary Examiner* — Jeff Vonch
(74) *Attorney, Agent, or Firm* — Keating & Bennett, LLP

(57) ABSTRACT

When a multilayer ceramic substrate with a cavity is reduced in thickness, a bottom wall portion defining the bottom of the cavity is reduced in thickness, thereby leading to the problem that the bottom wall portion is likely to be broken. A bottom wall portion defining a cavity of a multilayer ceramic substrate has a stack structure formed with a high thermal expansion coefficient layer sandwiched between first and second low thermal expansion coefficient layers. This configuration generates compression stress in the low thermal expansion coefficient layers during a cooling process after firing, thereby allowing the mechanical strength at the bottom wall portion to be improved.

2 Claims, 5 Drawing Sheets

(51) Int. Cl.
- *B32B 18/00* (2006.01)
- *H05K 1/03* (2006.01)
- *H05K 1/18* (2006.01)
- *H01L 23/13* (2006.01)
- *H01L 23/538* (2006.01)
- *H05K 3/46* (2006.01)
- *B32B 3/26* (2006.01)
- *H05K 1/02* (2006.01)

(52) U.S. Cl.
CPC ........ *H05K 3/4697* (2013.01); *H05K 2201/068* (2013.01); *H05K 2203/061* (2013.01); *H05K 2203/063* (2013.01); *C04B 2235/9607* (2013.01); *C04B 2237/62* (2013.01); *H01L 2224/16225* (2013.01); *H01L 2924/19105* (2013.01); *C04B 2237/343* (2013.01); *C04B 2237/348* (2013.01); *C04B 2237/562* (2013.01); *C04B 2237/58* (2013.01); *C04B 2237/68* (2013.01); *C04B 2237/702* (2013.01); *C04B 2237/704* (2013.01); *Y10S 428/901* (2013.01)
USPC ........... 428/212; 428/138; 428/201; 428/210; 428/426; 428/901; 257/E23.004; 257/E23.009

(56) References Cited

U.S. PATENT DOCUMENTS

| | | | |
|---|---|---|---|
| 7,670,672 B2* | 3/2010 | Iida | 428/210 |
| 7,790,271 B2* | 9/2010 | Urakawa | 428/210 |
| 7,883,765 B2* | 2/2011 | Sakamoto | 428/210 |
| 2003/0113554 A1* | 6/2003 | Umayahara et al. | 428/446 |
| 2003/0211302 A1 | 11/2003 | Mandai et al. | |
| 2007/0205692 A1* | 9/2007 | Nakao | 310/311 |
| 2007/0287012 A1* | 12/2007 | Kawai et al. | 428/427 |

FOREIGN PATENT DOCUMENTS

| | | |
|---|---|---|
| JP | 2003-273513 A | 9/2003 |
| JP | 2004-95767 A | 3/2004 |
| JP | 2007-67364 A | 3/2007 |
| JP | 2007-73728 A | 3/2007 |
| JP | 2008-30995 A | 2/2008 |

OTHER PUBLICATIONS

Machine Translation of JP 2004095767 A, Mar. 2004.*
Machine Translation of JP 2007073728 A, Mar. 2007.*
Official Communication issued in International Patent Application No. PCT/JP2009/057896, mailed on Jul. 28, 2009.

* cited by examiner

MULTILAYER CERAMIC SUBSTRATE AND METHOD FOR PRODUCING THE SAME

BACKGROUND OF THE INVENTION

1. Field of the Invention

The present invention relates to a multilayer ceramic substrate and a method for producing the multilayer ceramic substrate, and more particularly, to an improvement to increase the strength of a multilayer ceramic substrate including a cavity.

2. Description of the Related Art

Known methods for producing a multilayer ceramic substrate include, for example, a method described in Japanese Patent Application Laid-Open No. 2003-273513. In Japanese Patent Application Laid-Open No. 2003-273513, in order to solve the problem that a relatively high degree of shrinkage may occur at a location further away from an open end of a cavity, in which the shrinkage suppression effect produced by an outer constraining layer is weakened, to undesirably deform the cavity when a non-shrinkable process is used to produce a multilayer ceramic substrate including the cavity, a firing step is performed with a raw stacked body sandwiched between outer constraining layers including an inorganic material powder to suppress shrinkage while forming a constraining interlayer including the inorganic material powder to suppress shrinkage along a ceramic green layer of the raw stacked body to define a multilayer ceramic substrate, which is located at a location at which the cavity formed.

According to the production method described in Japanese Patent Application Laid-Open No. 2003-273513, in the firing step, the shrinkage suppression effect produced by the constraining interlayer acts in addition to the shrinkage suppression effect produced by the outer constraining layer, thereby substantially preventing shrinkage in the direction of the principal surface of the ceramic green layer, and enabling a multilayer ceramic substrate to be obtained without undesirable deformations of the cavity.

However, the multilayer ceramic substrate including a cavity has a problem in that a bottom wall portion defining the bottom of the cavity is likely to crack or break.

As the size of electronic devices including a multilayer ceramic substrate is reduced, the thickness of the multilayer ceramic substrate is required to be reduced. Therefore, particularly in the case of a multilayer ceramic substrate including a cavity, the thickness of the bottom wall portion must be reduced to achieve the reduction in the thickness of the multilayer ceramic substrate when the size of a mounted component to be disposed in the cavity is determined. Alternatively, when a peripheral portion defining the periphery of the cavity must be increased in height in order to accommodate mounted components having various sizes and shapes in the cavity, the bottom wall portion must be made thinner due to the increase in the height of the peripheral wall portion. As a result of these circumstances, the bottom wall portion is likely to be broken, and preventing such a break is a big issue.

In addition, the multilayer ceramic substrate including a cavity does not have a uniform thickness, i.e., the multilayer ceramic substrate has a relatively thin bottom wall portion defining the bottom of the cavity and a relatively thick peripheral wall portion defining the periphery of the cavity, makes it more likely to have undesirable deformations, such as warpage caused by firing. In this case, depending on the relationship between the thickness of the bottom wall portion and the height of the peripheral wall portion, deformations, such as warpage, may be more significantly produced in some cases. Therefore, when deformations, such as warpage, are to be prevented, the degree of design freedom of the multilayer ceramic substrate may be severely limited.

SUMMARY OF THE INVENTION

To overcome the problems described above, preferred embodiments of the present invention provide a multilayer ceramic substrate in which breakage of a bottom wall portion defining the bottom of a cavity is less likely to occur and in which undesirable deformations, such as warpage, are effectively suppressed, and a method for producing the multilayer ceramic substrate.

A preferred embodiment of the present invention provides a multilayer ceramic substrate which includes a cavity, including a peripheral wall portion including a first ceramic layer including a through hole arranged to define the cavity, and a bottom wall portion including second ceramic layers not including a through hole. In the multilayer ceramic substrate, the bottom wall portion includes at least two types of ceramic layers, the at least two types of ceramic layers including a high thermal expansion coefficient layer having a relatively high thermal expansion coefficient and a plurality of low thermal expansion coefficient layers having a relatively low thermal expansion coefficient, wherein at least a portion of the high thermal expansion coefficient layer is sandwiched between a first low thermal expansion coefficient layer and a second low thermal expansion coefficient layer of the plurality of low thermal expansion layers.

An outer surface of the bottom wall portion is preferably defined by the first low thermal expansion coefficient layer, and a surface of the bottom wall portion arranged in contact with the peripheral wall portion is preferably defined by the second low thermal expansion coefficient layer.

The peripheral wall portion preferably includes a high thermal expansion coefficient layer having a thermal expansion coefficient greater than that of the second low thermal expansion coefficient layer, and a third low thermal expansion coefficient layer having a relatively low thermal expansion coefficient defining the outermost layer of the peripheral wall portion.

The bottom wall portion preferably further includes a first constraining interlayer arranged in contact with the second low thermal expansion coefficient layer. In this case, the first constraining interlayer preferably includes an inorganic material powder which is not substantially sintered at a firing condition at which ceramic material included in the low thermal expansion coefficient layer is sintered, and the inorganic material powder is solidified by permeation of the ceramic material included in the low thermal expansion coefficient layer. However, the first constraining interlayer is not limited to being sandwiched between the low thermal expansion coefficient layers, and other arrangements may be provided.

The peripheral wall portion preferably further includes a second constraining interlayer arranged along a surface of the peripheral wall portion in contact with the bottom wall portion. In this case, the second constraining interlayer includes an inorganic material powder which is not substantially sintered at a firing condition at which a ceramic material included in the low thermal expansion coefficient layer is sintered, and the inorganic material powder is solidified by permeation of the ceramic material included in the low thermal expansion coefficient layer.

A through hole included in the second constraining interlayer preferably does not extend outwardly from an inner peripheral edge of the through hole in the first ceramic layer, the through hole included in the first ceramic layer of the peripheral wall portion is arranged in contact with the second constraining interlayer, and at least a portion of the inner peripheral edge defining the through hole in the second constraining interlayer is preferably located inwardly of the inner peripheral edge defining the through hole in the first ceramic layer of the peripheral wall portion arranged in contact with the second constraining interlayer.

Another preferred embodiment of the present invention provides a method for producing a multilayer ceramic substrate including a peripheral wall portion including a first ceramic layer including a through hole arranged to define a cavity, and a bottom wall portion including a plurality of second ceramic layers not including a through hole, wherein the bottom wall portion includes at least two types of ceramic layers, the at least two types of ceramic layers including a high thermal expansion coefficient layer having a relatively high thermal expansion coefficient and a plurality of low thermal expansion coefficient layers having a relatively low thermal expansion coefficient, and at least a portion of the high thermal expansion coefficient layer is sandwiched between a first low thermal expansion coefficient layer and a second low thermal expansion coefficient layer of the plurality of low thermal expansion coefficient layers.

The method for producing a multilayer ceramic substrate according to this preferred embodiment of the present invention includes the steps of preparing a first ceramic green layer including the through hole, the first ceramic green layer to be subjected to firing to form the first ceramic layer, and the first ceramic green layer including a low-temperature sintering ceramic material, preparing, as second ceramic green layers to be subjected to firing to form as the second ceramic layers, a high thermal expansion coefficient green layer to form the high thermal expansion coefficient layer, a first low thermal expansion coefficient green layer to form the first low thermal expansion coefficient layer, and a second low thermal expansion coefficient green layer to form the second low thermal expansion coefficient layer, each of the green layers including a low-temperature sintering ceramic material, producing a stacked composite body including a raw stacked body formed by stacking the first ceramic green layer and the second ceramic green layer, and an outer constraining layer provided on both principal surfaces of the raw stacked body, the outer constraining layer including an inorganic material powder which is not substantially sintered at a firing condition at which the low-temperature sintering ceramic material is sintered; firing the stacked composite body at a firing condition at which the low-temperature sintering ceramic material is sintered; and then removing the outer constraining layers from the stacked composite body.

The production method according to a preferred embodiment of the present invention is preferably used to produce a multilayer ceramic substrate in which an outer surface of the bottom wall portion is defined by the first low thermal expansion coefficient layer, and a surface of the bottom wall portion arranged in contact with the peripheral wall portion is defined by the second low thermal expansion coefficient layer. In this case, the raw stacked body preferably further includes, as the second ceramic green layer, a first constraining interlayer arranged in contact with the second low thermal expansion coefficient green layer. The first constraining interlayer preferably includes an inorganic material powder which is not substantially sintered at a firing condition at which the low-temperature sintering ceramic material is sintered, and the inorganic material powder is solidified by permeation of the ceramic material included in the low thermal expansion coefficient green layer as a result of the firing step.

In addition, the raw stacked body preferably further includes, as the first ceramic green layer, a second constraining interlayer arranged along a surface of the peripheral wall portion in contact with the bottom wall portion. In this case, the second constraining interlayer includes an inorganic material powder which is not substantially sintered at a firing condition at which a ceramic material included in the low thermal expansion coefficient layer is sintered, and the inorganic material powder is solidified by permeation of the ceramic material included in the low thermal expansion coefficient layer as a result of the firing step.

More preferably, in the raw stacked body, the through hole in the second constraining interlayer is made smaller than the through hole in the first ceramic green layer of the peripheral wall portion arranged in contact with the second constraining interlayer.

According to various preferred embodiments of the present invention, the bottom wall portion of the cavity has the stack structure including at least a portion of the high thermal expansion coefficient layer sandwiched between the first and second low thermal expansion coefficient layers, and the first and second low thermal expansion coefficient layers have compression stress generated during a cooling process after the firing. As a result, the strength at the bottom wall portion can be improved, thus making the bottom wall portion less likely to be broken.

In particular, when the outer surface of the bottom wall portion is defined by the first low thermal expansion coefficient layer, and when the surface of the bottom wall portion in contact with the peripheral wall portion is defined by the second low thermal expansion coefficient layer, the compression stress generated in the first and second low thermal expansion coefficient layers will act over substantially the entire thickness of the bottom wall portion, thereby enabling the strength of the entire bottom wall portion to be effectively improved.

The peripheral wall portion including the high thermal expansion coefficient layer and the third low thermal expansion coefficient layer defining the outermost layer of the peripheral wall portion improves the strength of the entire multilayer ceramic substrate, and greatly suppresses warpage caused by the stress difference between the front and back of the multilayer ceramic substrate.

When the first constraining interlayer is arranged in contact with the second low thermal expansion coefficient layer, shrinkage at the interface between the bottom wall portion and the peripheral wall portion is greatly suppressed during the firing, thereby preventing undesirable deformations, such as warpage of the multilayer ceramic substrate and cracks.

The suppression of undesirable deformations, such as warpage of the multilayer ceramic substrate, increases the degree of design freedom of the multilayer ceramic substrate including a cavity.

In the method for producing a multilayer ceramic substrate according to various preferred embodiments of the present invention, the stacked composite body to be subjected to firing includes the raw stacked body to form the multilayer ceramic substrate as well as the outer constraining layers, and shrinkage of the raw stacked body is greatly suppressed during the firing. As a result, the dimensional accuracy of the multilayer ceramic substrate is improved, and undesirable deformations, such as warpage, are prevented.

When the raw stacked body includes the first constraining interlayer, shrinkage is suppressed at a boundary between the bottom wall portion and the peripheral wall portion, undesirable deformations and cracks are prevented which may be caused at this site, and the dimensional accuracy is further improved.

In addition, when the raw stacked body further includes the second constraining interlayer arranged along the surface of the peripheral wall portion in contact with the bottom wall portion in the multilayer ceramic substrate, shrinkage is suppressed at a boundary between the bottom wall portion and the peripheral wall portion, and deformations and cracks which may occur at this location are effectively prevented.

In addition, when the through hole in the second constraining interlayer is made smaller than the through hole in the first ceramic green layer of the peripheral wall portion in contact with the second constraining interlayer, it is possible to increase the possibility that at least a portion of the inner peripheral edge defining the through hole in the second constraining interlayer can be located inwardly of the inner peripheral edge defining the through hole in the first ceramic green layer of the peripheral wall portion in contact with the second constraining interlayer, without locating the inner peripheral edge defining the through hole in the second constraining interlayer outwardly of the inner peripheral edge defining the through hole in the first ceramic green layer of the peripheral wall portion in contact with the second constraining interlayer, even if a deviation of the location of the through holes occurs between the second constraining interlayer and the first ceramic green layer in contact with the second constraining interlayer during the production of the raw stacked body. Therefore, modifications, cracks, defects, etc., can be suppressed and prevented with more certainty in the bottom wall portion of the cavity after the firing.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
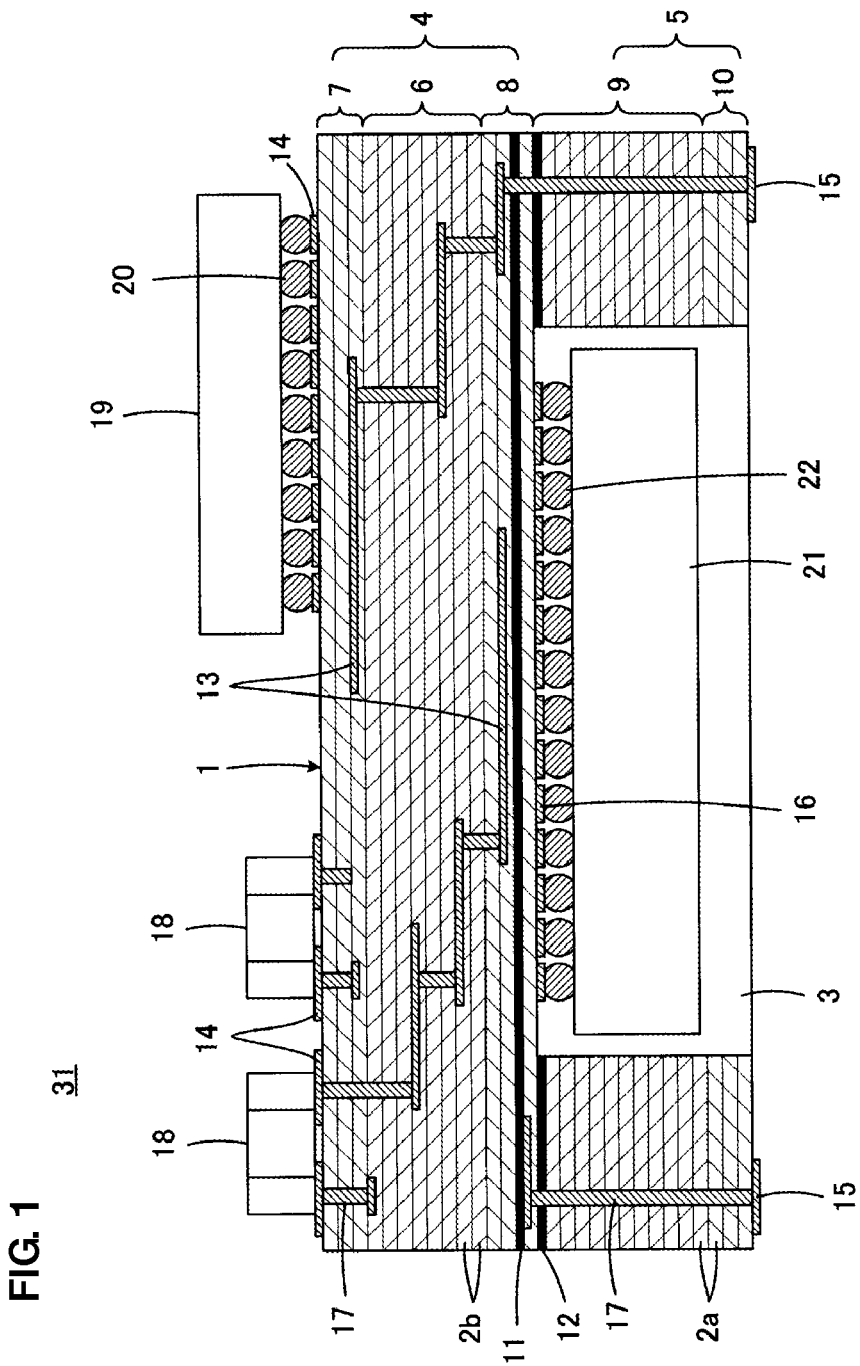
FIG. 1 is a cross-sectional view illustrating a functional module 31 including a multilayer ceramic substrate 1 according to a first preferred embodiment of the present invention.

FIG. 1 is a cross-sectional view illustrating a functional module 31 including a multilayer ceramic substrate 1 according to a first preferred embodiment of the present invention.

The multilayer ceramic substrate 1 includes a cavity 3 provided therein. The multilayer ceramic substrate 1 includes a bottom wall portion 4 defining the bottom of the cavity 3 and a peripheral wall portion 5 defining the periphery of the cavity 3.

The multilayer ceramic substrate 1 includes a stack structure including a plurality of first ceramic layers 2a including a through hole arranged to define the cavity and a plurality of second ceramic layers 2b which do not include a through hole, and the peripheral wall portion 5 includes the first ceramic layers 2a, whereas the bottom wall portion 4 includes the second ceramic layers 2b. The stacking of the first ceramic layers 2a including the through hole and the second ceramic layers 2b which do not include a through hole define the concave cavity 3 in the multilayer ceramic substrate 1. In addition, the bottom wall portion 4 includes a first high thermal expansion coefficient layer 6 which has a relatively high thermal expansion coefficient and first and second low thermal expansion coefficient layers 7 and 8 which have relatively low thermal expansion coefficients, wherein at least a portion of the first high thermal expansion coefficient layer 6 is sandwiched between the first and second low thermal expansion coefficient layers 7 and 8. In particular, in the present preferred embodiment, the outer surface of the bottom wall portion 4 includes the first low thermal expansion coefficient layer 7, and the surface of the bottom wall portion 4 in contact with the peripheral wall portion 5 includes the second low thermal expansion coefficient layer 8.

The peripheral wall portion 5 includes a second high thermal expansion coefficient layer 9, which has a higher thermal expansion coefficient than the second low thermal expansion coefficient layer 8, and a third low thermal expansion coefficient layer 10 which has a relatively low thermal expansion coefficient defining the outermost layer.

In addition, the bottom wall portion 4 preferably includes a first constraining interlayer 11 arranged in contact with the second low thermal expansion coefficient layer 8. In the present preferred embodiment, the first constraining interlayer 11 is preferably sandwiched between two of the second low thermal expansion coefficient layers 8. In addition, a second constraining interlayer 12 is preferably provided along the surface of the peripheral wall portion 5 in contact with the bottom wall portion 4. It is to be noted that the first constraining interlayer 11 may preferably be arranged so as to be sandwiched between the second low thermal expansion coefficient layer 8 and the first high thermal expansion coefficient layer 6.

The multilayer ceramic substrate 1 preferably includes a plurality of wiring conductors. The wiring conductors preferably define, for example, passive elements, such as capacitors or inductors, or wiring connections, such as an electrical connection between elements, and typically include conductor films 13 to 16 and via hole conductors 17, as shown in FIG. 1.

The conductor films 13 are preferably arranged inside the multilayer ceramic substrate 1. The conductive films 14 and are preferably arranged on principal surfaces of the multilayer ceramic substrate 1. The conductor films 16 are preferably arranged on the bottom of the cavity 3. The via hole conductors 17 are preferably arranged to pass through specific ones of the ceramic layers 2a and 2b in the thickness direction while being electrically connected to respective ones of the conductor films 13 to 16.

Chip components 18 and 19 electrically connected to the external conductor films 14 are preferably mounted on one principal surface of the multilayer ceramic substrate 1. FIG. 1 shows bump electrodes 20 arranged to electrically connect the chip component 19 to the external conductor films 14.

In addition, a chip component 21 electrically connected to the cavity bottom conductor films 16 is preferably mounted inside the cavity 3. FIG. 1 shows bump electrodes 22 arranged to electrically connect the chip component 21 to the cavity bottom conductor films 16.

As described above, the chip components 18, 19, and 21 are preferably mounted on the multilayer ceramic layer 1 to define the functional module 31. The external conductor films 15 arranged on the other principal surface of the multilayer ceramic substrate 1 preferably define electrical connections arranged to mount the functional module 31 onto a motherboard, not shown.

The multilayer ceramic substrate 1 described above is preferably manufactured, for example, as follows.

Figure 2:
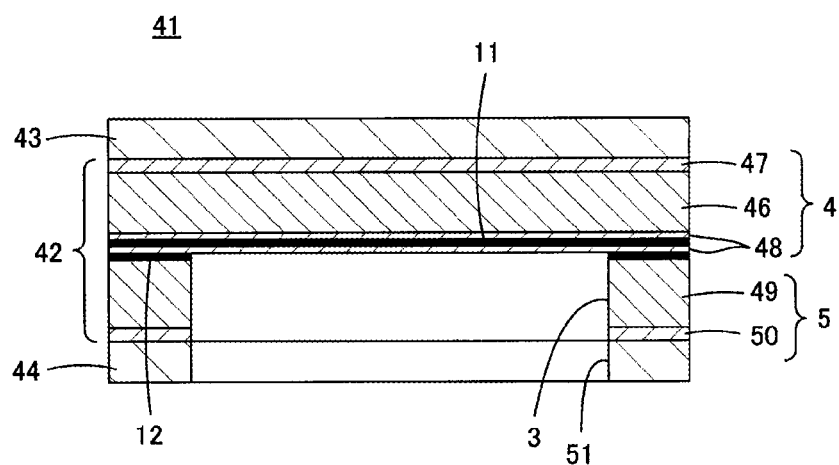
FIG. 2 is a cross-sectional view schematically illustrating a stacked composite body 41 produced in the process of manufacturing the multilayer ceramic substrate 1 shown in FIG. 1.

FIG. 2 shows a cross-sectional view illustrating a stacked composite body 41 produced in the process of manufacturing the multilayer ceramic substrate 1. The stacked composite body 41 includes a raw stacked body 42 to be subjected to firing to define the multilayer ceramic substrate 1, and first and second outer constraining layers 43 and 44 provided on the both principal surfaces of the raw stacked body 42. It is to be noted that the conductor films 13 to 16 and the via hole conductors 17 are omitted in FIG. 2.

With reference to FIG. 2 along with FIG. 1 for explanations, the raw stacked body 42 includes a bottom wall portion 4 defining the bottom of a cavity 3 and a peripheral wall portion 5 defining the periphery of the cavity 3, as in the multilayer ceramic substrate 1.

The bottom wall portion 4 of the raw stacked body 42 includes second ceramic green layers defining the second ceramic layers 2b, a first high thermal expansion coefficient green layer 46 to define the first high thermal expansion coefficient layer 6, a first low thermal expansion coefficient green layer 47 to define the first low thermal expansion coefficient layer 7, and a second low thermal expansion coefficient green layer 48 to define the second low thermal expansion coefficient layer 8. The peripheral wall portion 5 of the raw stacked body 42 includes first ceramic green layers to define the first ceramic layers 2a, a second high thermal expansion coefficient green layer 49 to define the second high thermal expansion coefficient layer 9 and a third low thermal expansion coefficient green layer 50 to define the third low thermal expansion coefficient layer 10. These green layers 46 to 50 include a low-temperature sintering ceramic material.

In addition, the raw stacked body 42 includes a first constraining interlayer 11 defining the second ceramic green layer and a second constraining interlayer 12 defining the first ceramic green layer. The constraining interlayers 11 and 12 include an inorganic material powder which is not substantially sintered at firing conditions which sinter the low-temperature sintering ceramic material.

It is to be noted that while each of the green layers 46 to 50 typically includes multiple layers, as is obvious from the multiple ceramic layers 2a and multiple ceramic layers 2b shown in FIG. 1, the interfaces between these multiple layers are not shown in FIG. 2. In addition, each of outer constraining layers 43 and 44 may preferably include multiple layers.

While the raw stacked body 42 is typically formed by stacking multiple ceramic green sheets, the raw stacked body 42 may instead be formed by repeatedly applying a ceramic slurry.

The outer constraining layers 43 and 44 are stacked on both principal surfaces of the raw stacked body 42, and subjected to pressure bonding, thereby providing the stacked composite body 41. Further, the second outer constraining layer 44 arranged on the cavity 3 side is provided with a through hole 51 in communication with the cavity 3.

Next, the stacked composite body 41 is fired at the firing conditions for sintering the low-temperature sintering ceramic material described above. In this firing step, the inorganic material powder included in the constraining interlayers 11 and 12 and the outer constraining layers 43 and 44 are not sintered, and the constraining interlayers 11 and 12 and the outer constraining layers 43 and 44 do not substantially shrink. Therefore, the shrinkage suppression effect produced by the constraining interlayers 11 and 12 and the outer constraining layers 43 and 44 acts on the raw stacked body 42 until the sintered multilayer ceramic substrate 1 is obtained. As a result, undesired deformations, such as warpage, are prevented from occurring in the obtained multilayer ceramic substrate 1, and the dimensional accuracy is significantly improved.

Next, the outer constraining layers 43 and 44 are preferably removed from the fired stacked composite body 41, by applying, for example, ultrasonic cleaning or blast processing. The fired outer constraining layers 43 and 44 are porous, and thus can be easily crushed and removed.

The constraining interlayers 11 and 12 include, as a result of the firing step, the inorganic material powder that is solidified by permeation of the material, i.e., a glass component, included in the low thermal expansion coefficient green layer 48 and/or the high thermal expansion coefficient green layer 49 adjacent to the constraining interlayers 11 and 12. It is to be noted that the constraining interlayers 11 and 12 must have a thickness which allows for the solidification caused by the permeation of this material.

The multilayer ceramic substrate 1 is obtained in the manner described above. The bottom wall portion 4 includes a stack structure including at least a portion of the first high thermal expansion coefficient layer 6 sandwiched between the first and second low thermal expansion coefficient layers 7 and 8. Accordingly, a compression stress is generated in the first and second low thermal expansion coefficient layers 7 and 8 during a cooling process after the firing step, thereby improving the mechanical strength of the bottom wall portion 4.

In addition, in this preferred embodiment, the third low thermal expansion coefficient layer 10 is also preferably provided in which compression stress is generated during the cooling process after the firing step. Therefore, it is possible to suppress undesired deformations, such as warpage, caused by the stress difference between the front and back of the multilayer ceramic substrate 1.

In the preferred embodiment described above, the low thermal expansion coefficient layers 7, 8, and 10 each preferably have a thickness of about 10 μm to about 100 μm, for example. The reasons are as follows.

The stress caused by the differences in thermal expansion coefficient acts at the interfaces between each of the low thermal expansion coefficient layers 7, 8, and 10 and each of the high thermal expansion coefficient layers 6 and 9. More specifically, a compression stress acts on the low thermal expansion coefficient layers 7, 8, and 10, and this compression stress is decreased with increasing distance from the interfaces. On the other hand, a tensile stress acts on the high thermal expansion coefficient layers 6 and 9, and this tensile stress is decreased with increasing distance from the interfaces. This is because the stress is relaxed with increasing distance from the interfaces. When the distance from the interface exceeds about 100 μm, the compression stress will not significantly act on the interfaces, and the effect of the compression stress will not be sufficiently produced. Accordingly, each of the low thermal expansion coefficient layers 7, 8, and 10 preferably has a thickness of 100 about μm or less, for example.

On the other hand, when the thicknesses of each the low thermal expansion coefficient layers 7, 8, and 10 are less than about 10 μm, the high thermal expansion coefficient layers 6 and 9 that is decreased in strength by the action the tensile stress will be present in near-outer surface regions located at less than about 10 μm from the outer surfaces of the respective low thermal expansion coefficient layers 7, 8, and 10. Therefore, the near-outer surface regions of the respective high thermal expansion coefficient layers 6 and 9 are likely to be crushed, and accordingly, each of the low thermal expansion coefficient layers 7, 8, and 10 preferably have a thickness of about 10 μm or greater, for example.

While the thicknesses of the high thermal expansion coefficient layers 6 and 9 are appropriately determined depending on the thickness of the entire multilayer ceramic substrate 1 and the respective thicknesses of the low thermal expansion coefficient layers 7, 8, and 10, the high thermal expansion coefficient layers 6 and 9 preferably have a thickness of about 10 μm to about 100 μm, for example, after firing step.

In addition, the respective thicknesses of the first and second low thermal expansion coefficient layers 7 and 8 sandwiching the first high thermal expansion coefficient layer 6 are preferably less than the thickness of the first high thermal expansion coefficient layer 6, because the compression stress can be utilized in an efficient manner. Likewise, the respective thicknesses of the second and third low thermal expansion coefficient layers 8 and 10 sandwiching the second high thermal expansion coefficient layer 9 are preferably less than the thickness of the second high thermal expansion coefficient layer 9. In addition, the first to third low thermal expansion coefficient layers 7, 8, and 10 are shown as having the same or substantially the same thickness as each other in FIG. 1, these thicknesses may preferably differ from each other in accordance with the design of the multilayer ceramic substrate 1, such as the balance between the bottom wall portion 4 and the peripheral wall portion 5 and the diameter of the cavity 3.

It is to be noted that while the low thermal expansion coefficient layer 7 is shown in FIG. 1 as including three ceramic layers 2b, the thickness of the low thermal expansion coefficient layer 7 refers to the total thickness of the three ceramic layers 2b. The same applies to the respective thickness of the other low thermal expansion coefficient layers 8 and 10 and the respective thicknesses of the high thermal expansion coefficient layers 6 and 9.

The difference in thermal expansion coefficient is preferably set in the range of about 1.0 ppmK$^{-1}$ to about 4.3 ppmK$^{-1}$ between the low thermal expansion coefficient layers 7, 8 and 10 and the high thermal expansion coefficient layers 6 and 9.

It has been discovered that the difference in thermal expansion coefficient of about 1.0 ppmK$^{-1}$ or greater significantly reduces the warpage of the bottom wall portion 4. More specifically, it has been discovered that the amount of warpage is decreased with an increase in the difference in thermal expansion coefficient in a range in difference in thermal expansion coefficient of less than about 1.0 ppmK$^{-1}$, and is substantially constant at about 1.0 ppmK$^{-1}$ or greater. This is believed to be because the stress acting in an in-plane direction which causes warpage of the multilayer ceramic substrate 1 is relatively small, as compared to the stress acting in an in-plane direction of front and back surfaces due to the difference in thermal expansion coefficient, resulting in correction of the warpage.

On the other hand, the difference in thermal expansion coefficient of about 4.3 ppmK$^{-1}$ or less can, with more certainty, prevent defects, such as delamination and voids, which are caused by the difference in thermal expansion coefficient at boundary sections between the low thermal expansion coefficient layers 7, 8 and 10 and the high thermal expansion coefficient layers 6 and 9.

The material defining the low thermal expansion coefficient layers 7, 8 and 10 preferably includes glass including $SiO_2$ and MO (provided that the MO is at least one selected from CaO, MgO, SrO, and BaO), with $SiO_2$:MO=23:7-17:13, for example, and the material defining the high thermal expansion coefficient layers 6 and 9 preferably includes glass containing $SiO_2$ and MO, with $SiO_2$:MO=19:11-11:19, for example.

More preferably, the $SiO_2$ included in the glass included in the material defining the low thermal expansion coefficient layers 7, 8 and 10 is about 34 weight % to about 73 weight %, for example, and the $SiO_2$ included in the glass included in the material about the high thermal expansion coefficient layers 6 and 9 is about 22 weight % to about 60 weight %, for example.

The preferable compositions and their contents as described above is suitable for the purpose of using a borosilicate glass based material to set to about 1.0 ppmK$^{-1}$ or more for the difference in thermal expansion coefficient between the low thermal expansion coefficient layers 7, 8 and 10 and the high thermal expansion coefficient layers 6 and 9 and set to about 75 weight % or greater for the ratio by weight of the common component, for example. The ratio by weight of the common component set to about 75 weight % or greater provides a sufficient joining force between each of the low thermal expansion coefficient layers 7, 8 and 10 and each of the high thermal expansion coefficient layers 6 and 9.

The $SiO_2$ component included in the glass contributes to reducing the thermal expansion coefficient, and the MO component contributes to increasing in thermal expansion coefficient.

In addition, since the deposition of a moderate amount of crystal from the glass in the process of firing is advantageous in terms of mechanical strength characteristics, the glass composition is preferably closer to the composition of the deposited crystal. For example, in the case of $SiO_2$-MO—$Al_2O_3$—$B_2O_3$ based glass, a $MAl_2Si_2O_8$ or a $MSiO_3$ crystal are likely to be deposited, and the ratio between $SiO_2$ and MO is thus preferably adjusted to so as to be closer to the composition of the crystal. Therefore, the glass composition for the low thermal expansion coefficient layers 7, 8 and 10 preferably has a ratio between $SiO_2$ and MO closer to about 2, for example, in order to reduce the thermal expansion coefficient, and the glass composition for the high thermal expansion coefficient layers 6 and 9 preferably has a ratio between $SiO_2$ and MO closer to about 1, for example, in order to increase the thermal expansion coefficient.

The glass composition for the high thermal expansion coefficient layers 6 and 9 preferably has an MO ratio greater than that of the low thermal expansion coefficient layers 7, 8 and 10, and is thus susceptible to corrosion during a plating process after the firing, but is insusceptible to fatal damage because the high thermal expansion coefficient layers 6 and 9 are not exposed to the surface.

If the glass includes too much $SiO_2$ in the low thermal expansion coefficient layers 7, 8 and 10 in order to increase the difference in thermal expansion coefficient, the glass viscosity will not be sufficiently decreased during the firing, thereby causing failures during sintering. A glass including too much MO results in the inability to ensure a sufficient difference in thermal expansion coefficient.

In addition, if the glass includes too much MO in the high thermal expansion coefficient layers 6 and 9 in order to increase the difference in thermal expansion coefficient, the moisture resistance is decreased, thereby causing insulation failures. A glass including too much $SiO_2$ results in the inability to ensure a sufficient difference in thermal expansion coefficient.

As described above, the ratio between $SiO_2$ and MO in the glass is preferably selected to fall within the range described above, for example, for each of the low thermal expansion coefficient layers 7, 8 and 10 and the high thermal expansion coefficient layers 6 and 9.

The glass included in the material defining the low thermal expansion coefficient layers 7, 8 and 10 preferably includes about 34 weight % to about 73 weight % of $SiO_2$, about 14 weight % to about 41 weight % of MO, about 0 weight % to about 30 weight % of $B_2O_3$, and about 0 weight % to about 30 weight % of $Al_2O_3$, for example, and the glass included in the material defining the high thermal expansion coefficient layers 6 and 9 preferably includes about 22 weight % to about 60 weight % of $SiO_2$, about 22 weight % to about 60 weight % of MO, about 0 weight % to about 20 weight % of $B_2O_3$, and about 0 weight % to about 30 weight % of $Al_2O_3$, for example.

The $B_2O_3$ provides the glass with a moderate viscosity in order to promote smooth sintering during the firing. If the glass includes too much $B_2O_3$, then the viscosity will be decreased too much, which causes over firing pores to be formed in the surface, thereby resulting in insulation failures. On the other hand, if the glass includes too little $B_2O_3$, the viscosity will be increased, thereby resulting in sintering failures.

The $Al_2O_3$ is a component defining the deposited crystals in the low thermal expansion coefficient layers 7, 8 and 10. If the glass includes too much or too little $Al_2O_3$, the deposition of crystals will be less likely to occur.

In addition, the $Al_2O_3$ improves the chemical stability of the glass, and thus, the plating resistance and the moisture resistance are improved in the high thermal expansion coefficient layers 6 and 9 which include a relatively large amount of MO. The $Al_2O_3$ makes an intermediate contribution between $SiO_2$ and MO to the thermal expansion coefficient, and the glass including too much $Al_2O_3$ results in an inability to ensure a sufficient difference in thermal expansion coefficient.

The material defining the low thermal expansion coefficient layers 7, 8 and 10 preferably includes 30 weight % to about 60 weight % of $Al_2O_3$ as a filler, for example, and the material defining the high thermal expansion coefficient layers 6 and 9 preferably includes about 40 weight % to about 70 weight % of $Al_2O_3$ as a filler, for example.

The $Al_2O_3$ filler contributes to increasing the mechanical strength. The material including too little $Al_2O_3$ filler results in insufficient mechanical strength. In particular, if the high thermal expansion coefficient layers 6 and 9 on which tensile stress acts have an insufficient mechanical strength, the high thermal expansion coefficient layers 6 and 9 will likely break, rendering them unable to produce the effect from the low thermal expansion coefficient layers 7, 8 and 10 reinforced by compression stress. Therefore, the high thermal expansion coefficient layers 6 and 9 include more $Al_2O_3$ filler than the low thermal expansion coefficient layers 7, 8 and 10 so as to increase the mechanical strength and withstand a larger difference in thermal expansion coefficient, and further to produce the effect from the reinforced low thermal expansion coefficient layers 7, 8 and 10.

The $Al_2O_3$ filler provides an intermediate contribution between the glass in the low thermal expansion coefficient layers 7, 8 and 10 and the glass in the high thermal expansion coefficient layers 6 and 9 to the thermal expansion coefficient, and the material including too much $Al_2O_3$ results in the inability to ensure a difference in thermal expansion coefficient.

It is to be noted that besides $Al_2O_3$, for example, other ceramics such as $ZrO_2$ may be used as the filler.

It is to be noted that it is not necessary that the first to third low thermal expansion coefficient layers 7, 8 and have the same composition as each other or have the same thermal expansion coefficient as each other, and it is also not necessary that the first and second high thermal expansion coefficient layers 6 and 9 have the same composition as each other or have the same thermal expansion coefficient as each other.

More specifically, when the thermal expansion coefficients for each of the first and second low thermal expansion coefficient layers 7 and 8 are less than the thermal expansion coefficient of the first high thermal expansion coefficient layer 6, the thermal expansion coefficient of the first low thermal expansion coefficient layer 7 and the thermal expansion coefficient of the second low thermal expansion coefficient layer 8 may differ from each other. In addition, when the thermal expansion coefficients for each of the second and third low thermal expansion coefficient layers 8 and 10 are less than the thermal expansion coefficient of the second high thermal expansion coefficient layer 9, the thermal expansion coefficient of the second low thermal expansion coefficient layer 8 and the thermal expansion coefficient of the third low thermal expansion coefficient layer 10 may differ from each other. Accordingly, as long as the conditions described above are satisfied, the respective thermal expansion coefficients can be freely determined, and as a result, the degree of design freedom of the cavity 3 is improved.

Figure 3:
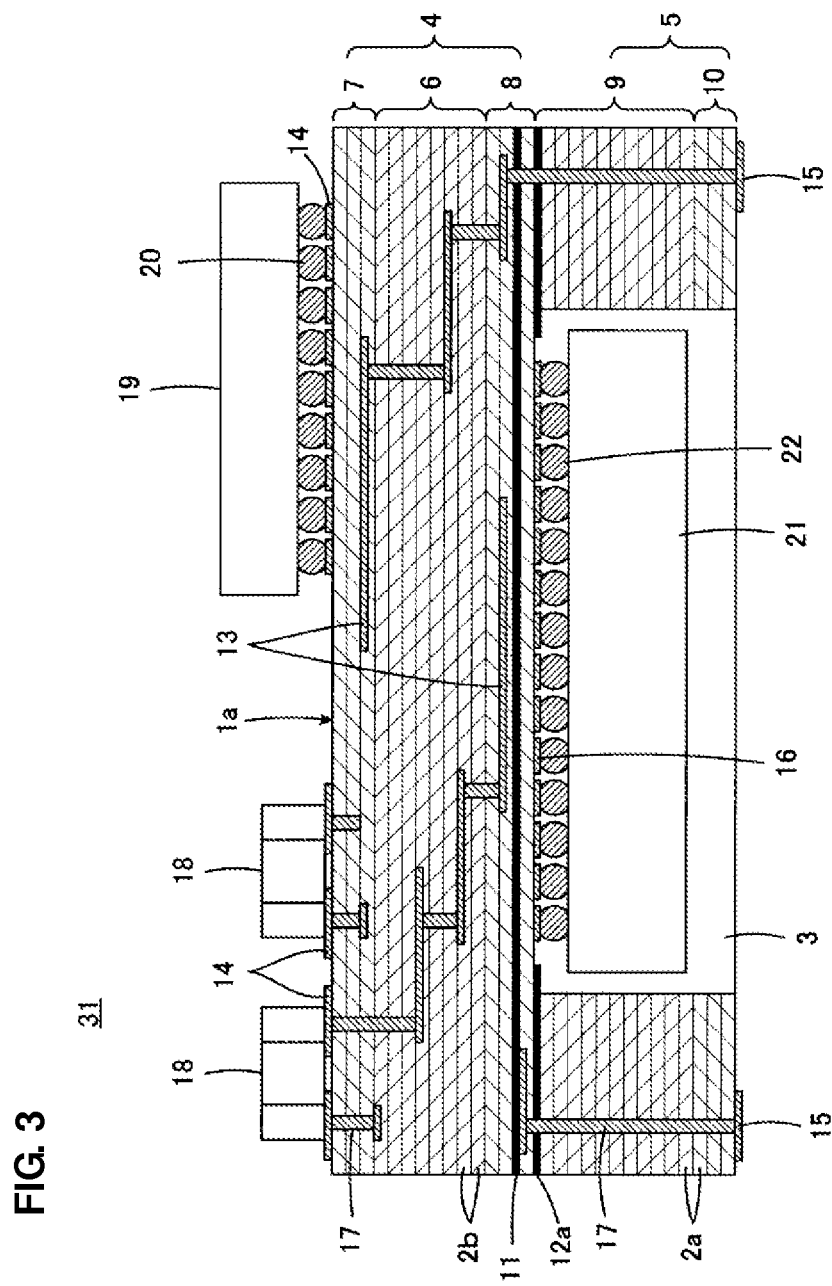
FIG. 3 is a cross-sectional view illustrating a functional module 31 including a multilayer ceramic substrate 1a according to a second preferred embodiment of the present invention.
Figure 4:
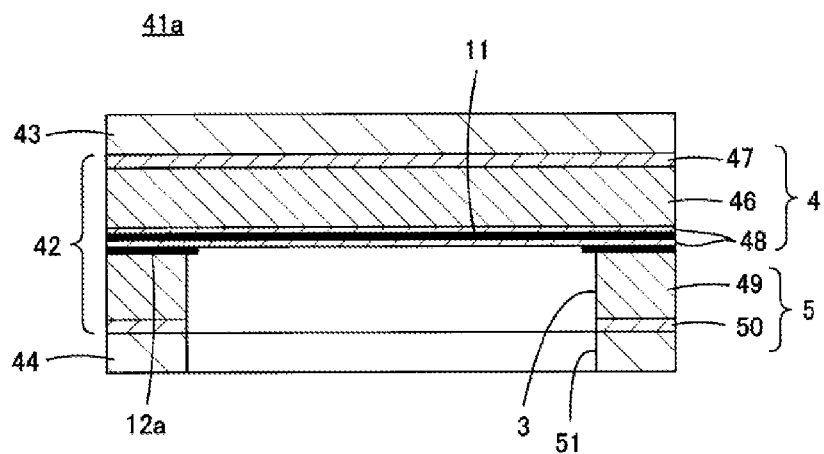
FIG. 4 is a cross-sectional view schematically illustrating a stacked composite body 41a produced in the process of manufacturing the multilayer ceramic substrate 1a shown in FIG. 3.

FIGS. 3 and 4 are diagrams describing a second preferred embodiment of the present invention, which respectively correspond to FIGS. 1 and 2. In FIGS. 3 and 4, the same reference numerals are assigned to elements corresponding to the elements shown in FIGS. 1 and 2, and redundant descriptions are omitted.

A multilayer ceramic substrate 1a according to the second preferred embodiment includes an inner peripheral edge of a second constraining interlayer 12a defining a through hole is located inwardly of an inner peripheral edge of a first ceramic layer 2a of a peripheral wall portion 5 in contact with the second constraining interlayer 12a, as shown in FIG. 3.

It is to be noted that it is not necessary that the entire inner peripheral edge of the second constraining interlayer 12a arranged to define a through hole (hereinafter, referred to as a "first through hole for cavity formation") is located inwardly of the inner peripheral edge of the first ceramic layer 2a in contact with the second constraining interlayer 12a arranged to define a through hole (hereinafter, referred to as a "second through hole for cavity formation"). More specifically, all that is required is that at least a portion of the inner peripheral edge for defining the first through hole for cavity formation is located inwardly of the inner peripheral edge for defining the second through hole for cavity formation.

It is important that the inner peripheral edge for defining the first through hole for cavity formation is not located outwardly of the inner peripheral edge for defining the second through hole for cavity formation. For example, if a portion of the inner peripheral edge for defining the first through hole for cavity formation is not located inwardly of the inner peripheral edge for defining the second through hole for cavity formation, the portion must be located at least in the same position as the inner peripheral edge for defining the second through hole for cavity formation.

More specifically, when the first and second through holes for cavity formation have a substantially quadrilateral shape, even when the inner peripheral edge for defining the first through hole for cavity formation is located inwardly of the inner peripheral edge for defining the second through hole for cavity formation on only two sides of the quadrilateral, the inner peripheral edge for defining the first through hole for cavity formation cannot be located outwardly of the inner peripheral edge for defining the second through hole for cavity formation for the other two sides of the quadrilateral, and must be located at least in the same location as the inner peripheral edge for defining the second through hole for cavity formation.

When the multilayer ceramic substrate 1a according to the second preferred embodiment is to be produced, the first through hole for cavity formation is smaller than the second through hole for cavity formation in a raw stacked body 42 provided in a stacked composite body 41a, as shown in FIG. 4, such that at least a portion of the inner peripheral edge for defining the first through hole for cavity formation is located inwardly of the inner peripheral edge for defining the second through hole for cavity formation.

According to the second preferred embodiment, a step of stacking green sheets is performed in many cases for the production of the raw stacked body 42, and in this stacking step, even if a deviation in position of through holes for cavity formation is undesirably caused between the second constraining interlayer 12a and a first ceramic green layer in contact with the second constraining interlayer 12a, it is possible to increase the likelihood that at least a portion of the inner peripheral edge for defining the first through hole for cavity formation can be located inwardly of the inner peripheral edge for defining the second through hole for cavity formation, without locating the inner peripheral edge for defining the first through hole for cavity formation outwardly of the inner peripheral edge for defining the second through hole for cavity formation. Therefore, the second preferred embodiment prevents deformations and cracks in the bottom wall portion 4 of the cavity 3 with greater certainty after firing.

Figure 5:
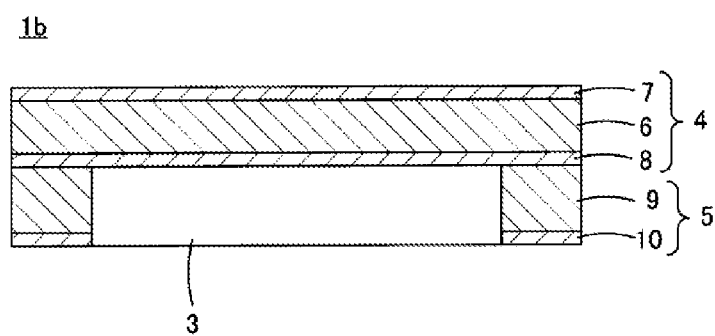
FIG. 5 is a cross-sectional view schematically illustrating a multilayer ceramic substrate 1b according to a third preferred embodiment of the present invention.

FIG. 5 is a cross sectional view illustrating a multilayer ceramic substrate 1b according to a third preferred embodiment of the present invention. While the multilayer ceramic substrate 1b is schematically shown in FIG. 5 as compared with FIG. 1, the same reference numerals are assigned to elements corresponding to the elements shown in FIG. 1, and redundant descriptions are omitted.

The multilayer ceramic substrate 1b shown in FIG. 5 includes no constraining interlayer. The remaining configuration preferably is substantially the same as the multilayer ceramic substrate 1 shown in FIG. 1 or the multilayer ceramic substrate 1a shown in FIG. 3.

Another preferred embodiment of the present invention is the multilayer ceramic substrate 1, 1a, or 1b that includes no third low thermal expansion coefficient layer 10.

Figure 6:
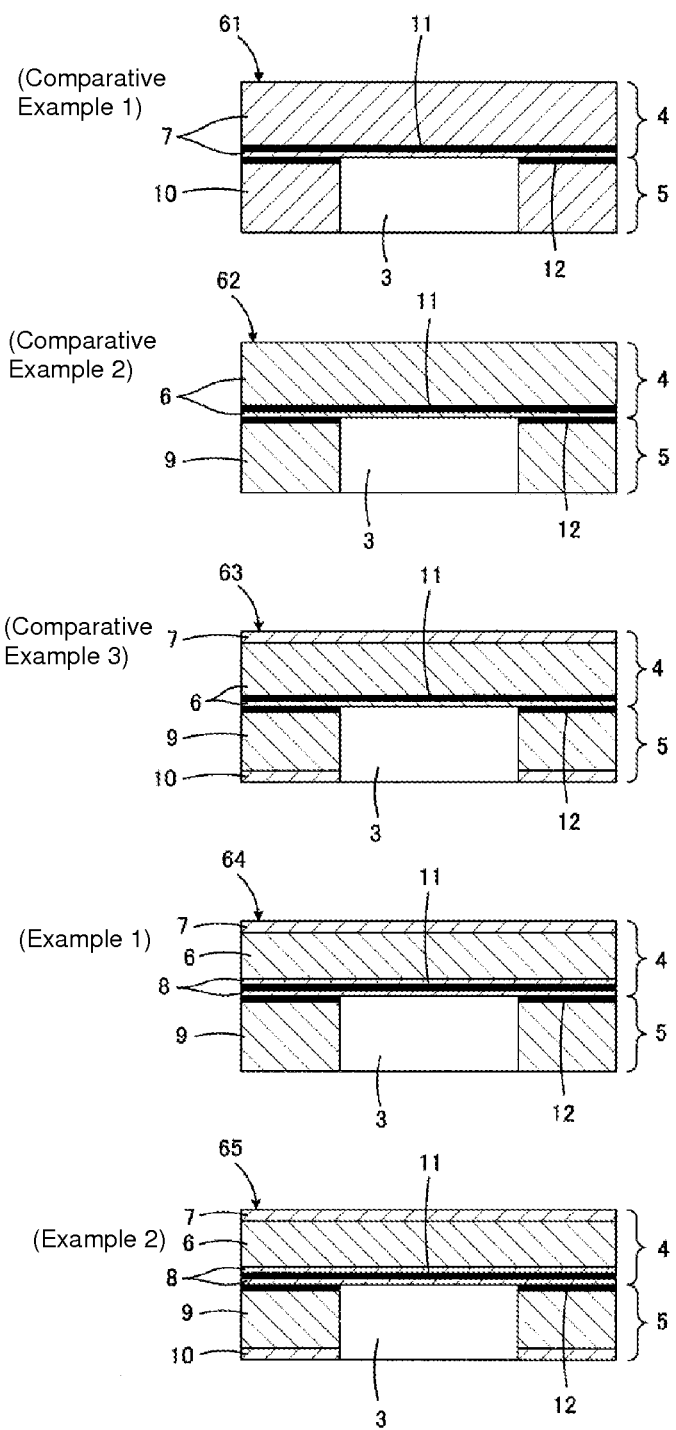
FIG. 6 includes cross-sectional views schematically illustrating multilayer ceramic substrates 61 to 65 according to Comparative Examples 1 to 3 and Examples 1 and 2, which were produced in an experimental example performed to confirm an advantageous effect of a preferred embodiment of the present invention.

Next, an experimental example will be described which was performed to confirm the advantageous effects of preferred embodiments of the present invention. In this experimental example, multilayer ceramic substrates 61 to 65 according to each of Comparative Examples 1 to 3 and Examples 1 and 2 were produced as shown in the cross-sectional views of FIG. 6. In FIG. 6, the same reference numerals are assigned to elements corresponding to the elements shown in FIG. 1, and redundant descriptions are omitted.

The multilayer ceramic substrate 65 according to Example 2 has the structure of the multilayer ceramic substrate 1 shown in FIG. 1.

As compared to the multilayer ceramic substrate 65 according to Example 2, the multilayer ceramic substrate 61 according to Comparative Example 1 is configured such that all of the ceramic layers defining a bottom wall portion 4 are low thermal expansion coefficient layers 7 and all of ceramic layers defining a peripheral wall portion 5 are low thermal expansion coefficient layers 10.

The multilayer ceramic substrate 62 according to Comparative Example 2 is configured such that all of the ceramic layers defining a bottom wall portion 4 are high thermal expansion coefficient layers 6 and all of the ceramic layers defining a peripheral wall portion 5 are high thermal expansion coefficient layers 9.

The multilayer ceramic substrate 63 according to Comparative Example 3 is configured such that a bottom wall portion 4 includes no second low thermal expansion coefficient layers 8 and high thermal expansion coefficient layers 6 are provided for the second low thermal expansion coefficient layers 8.

The multilayer ceramic substrate 64 according to Example 1 includes no third low thermal expansion coefficient layer 10 and a high thermal expansion coefficient layer 9 provided for the third low thermal expansion coefficient layer 10.

In this experimental example, the thermal expansion coefficient was set to about 5.3 ppmK$^{-1}$ for the low thermal expansion coefficient layers 7, 8, and 10. In addition, in order to form the low thermal expansion coefficient layers 7, 8, and 10, green sheets having a thickness of about 50 µm were produced, and an appropriate number of the green sheets were stacked to provide a desired thickness as will be described later.

The green sheets for the low thermal expansion coefficient layers 7, 8, and 10 include a borosilicate based glass powder and a ceramic powder at a ratio by weight of about 60:40, which were obtained by adding about 50 parts by weight of an organic solvent, about 10 parts by weight of a butyral based binder, and about 1 part by weight of a plasticizer to about 100 parts by weight of the total of the glass powder and the ceramic powder to provide a slurry, removing air bubbles from this slurry, then forming the slurry into the shape of a sheet in accordance with a doctor blade method, and drying the formed sheets. Powder including about 46 weight % of $SiO_2$, 30 weight % of $B_2O_3$, about 14 weight % of CaO, about 5 weight % of $Al_2O_3$, and about 5 weight % of $TiO_2$ was used as the borosilicate based glass powder, and $Al_2O_3$ powder was used as the ceramic powder.

The thermal expansion coefficient was set to about 7.7 ppmK$^{-1}$ for the high thermal expansion coefficient layers 6 and 9. In addition, in order to form the high thermal expansion coefficient layers 6 and 9, green sheets having a thickness of about 50 µm were produced, and an appropriate number of the green sheets were stacked to provide a desired thickness as will be described later.

The green sheets for the high thermal expansion coefficient layers 6 and 9 include a borosilicate glass powder and a ceramic powder at a ratio by weight of about 70:30, which were obtained by adding an organic solvent, a butyral based binder, and a plasticizer at the same ratio as in the case of the low thermal expansion coefficient layers described above to about 100 parts by weight of the total of the glass powder and the ceramic powder, and going through the same operations. Powder including about 40 weight % of $SiO_2$, about 5 weight % of $B_2O_3$, about 40 weight % of CaO, about 5 weight % of MgO, and about 10 weight % of $Al_2O_3$ was used as the borosilicate glass powder, and $Al_2O_3$ powder was used as the ceramic powder.

In order to form the constraining interlayers 11 and 12, green sheets having a thickness of about 10 μm were produced, and in order to form outer constraining layers, not shown in FIG. 6, green sheets having a thickness of about 100 μm were produced. The green sheets for the constraining interlayers 11 and 12 and the outer constraining layers include about 100 parts by weight of an alumina powder, about 10 parts by weight of a butyral based binder, and about 1 part by weight of a plasticizer, which were obtained through substantially the same operations as in the case of the low thermal expansion coefficient layers.

As a conductive paste for conductor films and via hole conductors, not shown in FIG. 6, a conductive paste was used that includes about 48 parts by weight of a silver powder, about 3 parts by weight of an ethyl cellulose binder, and about 49 parts by weight of an organic solvent, terpenes, and this conductive paste was applied to specific green sheets in order to form the conductor films 13 to 16 and the via hole conductors 17 as shown in FIG. 1.

Next, the various types of green sheets were stacked to the number of sheets shown in the column "The Number of Green Sheets Used" of the following Table 1, thereby producing raw stacked bodies defining the multilayer ceramic substrates 61 to 65, and outer constraining layers were formed on the top and bottom of the raw stacked bodies to produce stacked composite bodies. In this case, the outer constraining layers were formed by stacking four of the green sheets having a thickness of about 100 μm on each of the bottom and top of the raw stacked bodies.

TABLE 1

| | | | The Number of Green Sheets Used |
|---|---|---|---|
| Comparative Example 1 | Bottom Wall Portion | Low Thermal Expansion Coefficient Layer | 18 |
| | | Constraining Interlayer | 1 |
| | Peripheral Wall Portion | Low Thermal Expansion Coefficient Layer | 18 |
| | | Constraining Interlayer | 1 |
| Comparative Example 2 | Bottom Wall Portion | High Thermal Expansion Coefficient Layer | 18 |
| | | Constraining Interlayer | 1 |
| | Peripheral Wall Portion | High Thermal Expansion Coefficient Layer | 18 |
| | | Constraining Interlayer | 1 |
| Comparative Example 3 | Bottom Wall Portion | Low Thermal Expansion Coefficient Layer | 3 |
| | | High Thermal Expansion Coefficient Layer | 15 |
| | | Constraining Interlayer | 1 |
| | Peripheral Wall Portion | Low Thermal Expansion Coefficient Layer | 3 |
| | | High Thermal Expansion Coefficient Layer | 15 |
| | | Constraining Interlayer | 1 |
| Example 1 | Bottom Wall Portion | Low Thermal Expansion Coefficient Layer | 6 (3 + 3) |
| | | High Thermal Expansion Coefficient Layer | 12 |
| | | Constraining Interlayer | 1 |
| | Peripheral Wall Portion | High Thermal Expansion Coefficient Layer | 18 |
| | | Constraining Interlayer | 1 |
| Example 2 | Bottom Wall Portion | Low Thermal Expansion Coefficient Layer | 6 (3 + 3) |
| | | High Thermal Expansion Coefficient Layer | 12 |
| | | Constraining Interlayer | 1 |

TABLE 1-continued

| | | | The Number of Green Sheets Used |
|---|---|---|---|
| | Peripheral Wall Portion | Low Thermal Expansion Coefficient Layer | 3 |
| | | High Thermal Expansion Coefficient Layer | 15 |
| | | Constraining Interlayer | 1 |

Then, the stacked composite bodies were fired at a temperature of about 870° C. for about 10 minutes. Next, the porous outer constraining layers attached to the surfaces of the stacked composite bodies fired were removed using an ultrasonic cleaning machine to obtain the multilayer ceramic substrates 61 to 65 according to Comparative Examples 1 to 3 and Examples 1 and 2.

Next, in order to compare the mechanical strengths of the respective multilayer ceramic substrates 61 to 65 against drop impacts, the following test was performed.

Each of the multilayer ceramic substrates 61 to 65 was mounted on a mounting board with solder, and the mounting board was attached to the inside of a substantially rectangular parallelepiped housing and dropped toward a concrete block. In this case, dropping while sequentially facing the respective six surfaces of the housing downward was referred to as 1 cycle, and this test was performed up to 10 cycles. The bottom wall portions 4 of the respective multilayer ceramic substrates 61 to 65 were evaluated to determine whether the bottom wall portions were crushed or cracked. The results are shown in Table 2.

TABLE 2

| | The Number of Cycles Implemented | Condition of Bottom Wall Portion |
|---|---|---|
| Comparative Example 1 | 4 | Crushed |
| Comparative Example 2 | 4 | Crushed |
| Comparative Example 3 | 7 | Cracked |
| Example 1 | 10 | Not Crushed or Cracked |
| Example 2 | 10 | Not Crushed or Cracked |

As is clear from Table 2, the bottom wall portions 4 of the multilayer ceramic substrates 61 and 62 were crushed in the fourth cycle in Comparative Examples 1 and 2. In addition, in Comparative Example 3, the bottom wall portion 4 was cracked in the seventh cycle while complete crushing was prevented.

In contrast, no crushing or cracking occurred in 10 cycles in Examples 1 and 2.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer ceramic substrate including a cavity, comprising:
   a peripheral wall portion including a first ceramic layer including a through hole arranged to define the cavity; and a bottom wall portion including a plurality of second ceramic layers not including a through hole; wherein the plurality of second ceramic layers of the bottom wall portion includes at least two types of ceramic layers, the at least two types of ceramic layers including a first high thermal expansion coefficient layer having a high thermal expansion coefficient and a plurality of low thermal expansion coefficient layers having a low thermal expansion coefficient that is less than the high thermal expansion coefficient, and at least a portion of the first high thermal expansion coefficient layer is sandwiched between a first low thermal expansion coefficient layer and at least one second low thermal expansion coefficient layer of the plurality of low thermal expansion coefficient layers;

an outer surface of the bottom wall portion is defined by the first low thermal expansion coefficient layer, and a surface of the bottom wall portion arranged in contact with the peripheral wall portion is defined by the at least one second low thermal expansion coefficient layer;

the bottom wall portion further includes a first constraining interlayer arranged between two of the at least one second low thermal expansion coefficient layer or between the at least one second low thermal expansion coefficient layer and the first high thermal expansion coefficient layer, the first constraining interlayer of the bottom wall portion includes an inorganic material powder which is not substantially sintered at a firing condition at which a ceramic material included in the plurality of low thermal expansion coefficient layers is sintered, and the inorganic material powder is solidified by permeation of the ceramic material included in the plurality of low thermal expansion coefficient layers;

the peripheral wall portion further includes a second constraining interlayer provided along a surface of the peripheral wall portion in contact with the bottom wall portion, arranged so as to be provided only between the peripheral wall portion and the bottom wall portion, and including a through hole therein that corresponds to a position of the through hole in the peripheral wall portion;

at least one pair of the plurality of second ceramic layers of the bottom wall portion are in direct contact with one another with no constraining interlayer disposed therebetween; and the peripheral wall portion includes a second high thermal expansion coefficient layer having a thermal expansion coefficient greater than that of the at least one second low thermal expansion coefficient layer and a third low thermal expansion coefficient layer having a thermal expansion coefficient less than a thermal expansion coefficient of the second high thermal expansion coefficient layer and defining an outermost layer of the peripheral wall portion.

2. The multilayer ceramic substrate according to claim 1, wherein the second constraining interlayer of the peripheral wall portion includes an inorganic material powder which is not substantially sintered at a firing condition at which a ceramic material included in the plurality of low thermal expansion coefficient layers is sintered, and the inorganic material powder is solidified by permeation of the ceramic material included in the plurality low thermal expansion coefficient layers.

* * * * *